United States Patent
Hector, Jr. et al.

(10) Patent No.: US 7,993,537 B2
(45) Date of Patent: Aug. 9, 2011

(54) METHOD FOR IMPROVING ADHESION BETWEEN A SHAPE MEMORY ALLOY AND A POLYMER

(75) Inventors: Louis G. Hector, Jr., Shelby Township, MI (US); Andrew M. Mance, Royal Oak, MI (US); William R. Rodgers, Bloomfield Township, MI (US); Pablo D. Zavattieri, Ann Arbor, MI (US); David A. Okonski, Lake Orion, MI (US); Elena Sherman, Culver City, CA (US); William Barvosa-Carter, Ventura, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 854 days.

(21) Appl. No.: 11/678,098

(22) Filed: Feb. 23, 2007

(65) Prior Publication Data

US 2008/0202637 A1 Aug. 28, 2008

(51) Int. Cl.
*C03C 15/00* (2006.01)
*C22F 1/00* (2006.01)
(52) U.S. Cl. .......................................... 216/34; 148/402
(58) Field of Classification Search .................... 216/34, 216/8, 33, 37, 96; 427/309; 148/280, 96, 148/240, 402; 29/592
See application file for complete search history.

(56) References Cited

U.S. PATENT DOCUMENTS

| | | | |
|---|---|---|---|
| 4,788,176 A | 11/1988 | Wieserman et al. ......... 502/401 |
| 5,032,237 A | 7/1991 | Wieserman et al. ......... 204/38.3 |
| 5,059,258 A | 10/1991 | Wefers et al. ............... 148/272 |
| 5,277,788 A | 1/1994 | Nitowski et al. ............ 205/175 |
| 5,705,082 A * | 1/1998 | Hinson ........................ 216/95 |
| 6,167,609 B1 | 1/2001 | Marinelli et al. ........... 29/469.5 |
| 6,500,558 B2 | 12/2002 | Yamagachi .................. 428/469 |
| 6,655,218 B1 | 12/2003 | Ogisu et al. .................. 73/768 |
| 6,958,307 B2 | 10/2005 | Forestiere et al. .......... 502/162 |
| 2005/0198904 A1* | 9/2005 | Browne et al. ............... 49/374 |
| 2006/0151070 A1* | 7/2006 | Rodzewich et al. ......... 148/247 |

OTHER PUBLICATIONS

Randall G. Schmidt adn Hames P. Bell, Expoxy Adhesion to Metals, Mar. 1986, Springer Berlin/ Heidelberg, vol. 75, pp. 35-71.*
Ralph C Smtih, Smart Material Systems: Model Vecelopment, 2005, SIAM, vol. 32, p. 21. As found on Google Books: http://books.google.com/books?id=SPkfN0DiMawC&pg=PA21&dq=Shape+memory+alloys+Ralph+Smith#v=onepage&q=&f=false.*
L.G. Hector, Jr., S.M. Opalka, G.A. Nitowski, L. Wieserman, D.J. Siegel, H. Yu, J.B. Adams, "Investigation of vinyl phosphonic acid/hydroxylated α-Al2O3(0001) reaction enthalpies" Surface Science 494 (2001) 1-20.
Subramaniam, Ameendraraj, "Fatigue Behavior of Copper Zinc Aluminum Shape Memory Alloys," A Thesis Submitted to the Faculty of Graduate Studies in Partial Fulfillment for the Degree of Master of Science, Department of Civil Engineering, University of Manitoba, Mar. 1998, 133 pages.

* cited by examiner

*Primary Examiner* — Nadine G Norton
*Assistant Examiner* — Patti Lin
(74) *Attorney, Agent, or Firm* — Cantor Colburn LLP

(57) ABSTRACT

Methods for improving adhesion between a shape memory alloy and a polymeric material include functionalizing a surface of the shape memory polymer with a phosphorous containing compound or an organosilane coupling agent. Other methods include surface texturing the shape memory alloy surface, independently or in combination with the functionalization.

24 Claims, 4 Drawing Sheets

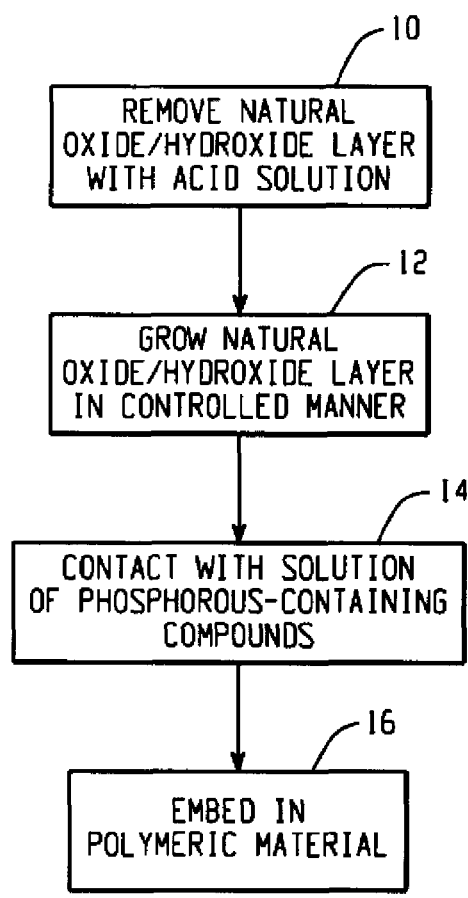
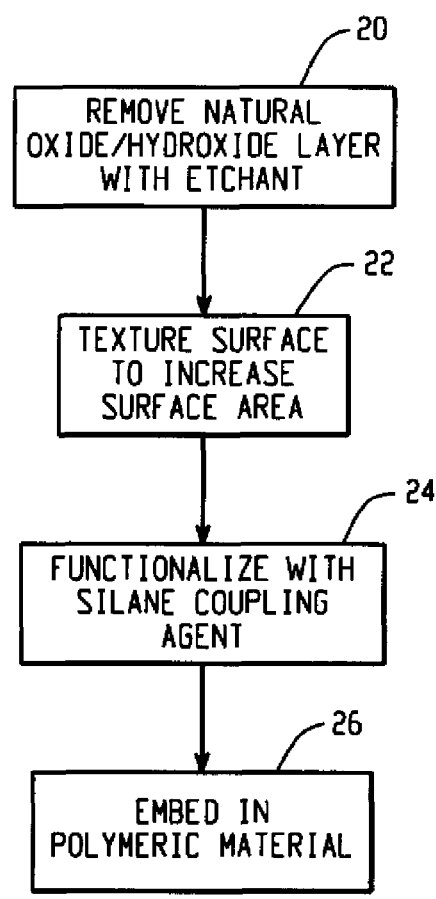
Fig. 1
Fig. 2

METHOD FOR IMPROVING ADHESION BETWEEN A SHAPE MEMORY ALLOY AND A POLYMER

BACKGROUND

The present disclosure generally relates to methods for improving adhesion between a metal and a polymeric material, and more particularly to improving chemical and/or mechanical adhesion between a shape memory alloy and the polymeric material.

Applications of shape memory alloys (SMA) can include embedding of the SMA material into a polymer material composite to control external shape, change stiffness, and provide vibration control of the composite, for example. The performance of applications comprising SMA material embedded in a polymeric material is heavily dependent on the quality of the SMA-polymer adhesion. The interface must have sufficient adhesion to transfer the stresses and strains from the SMA constituents to the surrounding material; the stronger the adhesion, the higher level of strain that can be transferred prior to mechanical failure. An exemplary use would be an automotive component with numerous SMA wires embedded in a polymeric material. The embedded wires must remain adhered to the polymeric material when they are deformed, for example, by application of an external current.

One method for improving adhesion between the SMA and the polymer involves treating the surface of the SMA with silane coupling agents prior to bonding the SMA to a reactive polymeric material, for example, an epoxy resin. However, the use of silane coupling agents can produce toxic compounds. Additionally, the silane coupling agents must be hydrolyzed before use, and the hydrolyzed solutions have a very finite stable lifetime. Moreover, adhesion quality needs to be improved for certain applications. Another approach involves hand sanding or sandblasting the SMA material. However, as the size of the SMA used in an application decreases to micron- or nano-sized particles, sanding or sandblasting treatments become difficult and not suitable.

Accordingly, a need exists for improved methods of adhering shape memory alloys to polymeric materials.

BRIEF SUMMARY

Disclosed herein are methods for improving adhesion between a shape memory alloy (SMA) and a polymer. In one embodiment, the method for improving adhesion between a shape memory alloy and a polymeric material comprises contacting a surface of a shape memory alloy with a solution comprising phosphorous-containing compounds, and embedding the shape memory alloy in a polymeric material.

In another embodiment, the method comprises texturing a surface of the shape memory alloy, and embedding the shape memory alloy in a polymeric material.

In yet another embodiment, the method comprises texturing a surface of the shape memory alloy to form a textured surface, contacting the textured surface of a shape memory alloy with a solution comprising a phosphorous-containing compound or a silane coupling agent, and embedding the shape memory alloy in a polymeric material.

The above described and other features are exemplified by the following Figures and detailed description.

BRIEF DESCRIPTION OF THE DRAWINGS

Referring now to the figures, which are exemplary embodiments and wherein the like elements are numbered alike.

FIG. 1 is a schematic illustration of an embodiment of a method of treating a shape memory alloy (SMA) for improved adhesion with a polymer.

FIG. 2 is a schematic illustration of another method of treating the SMA for improved adhesion with a polymer.

DETAILED DESCRIPTION

Figure 3:
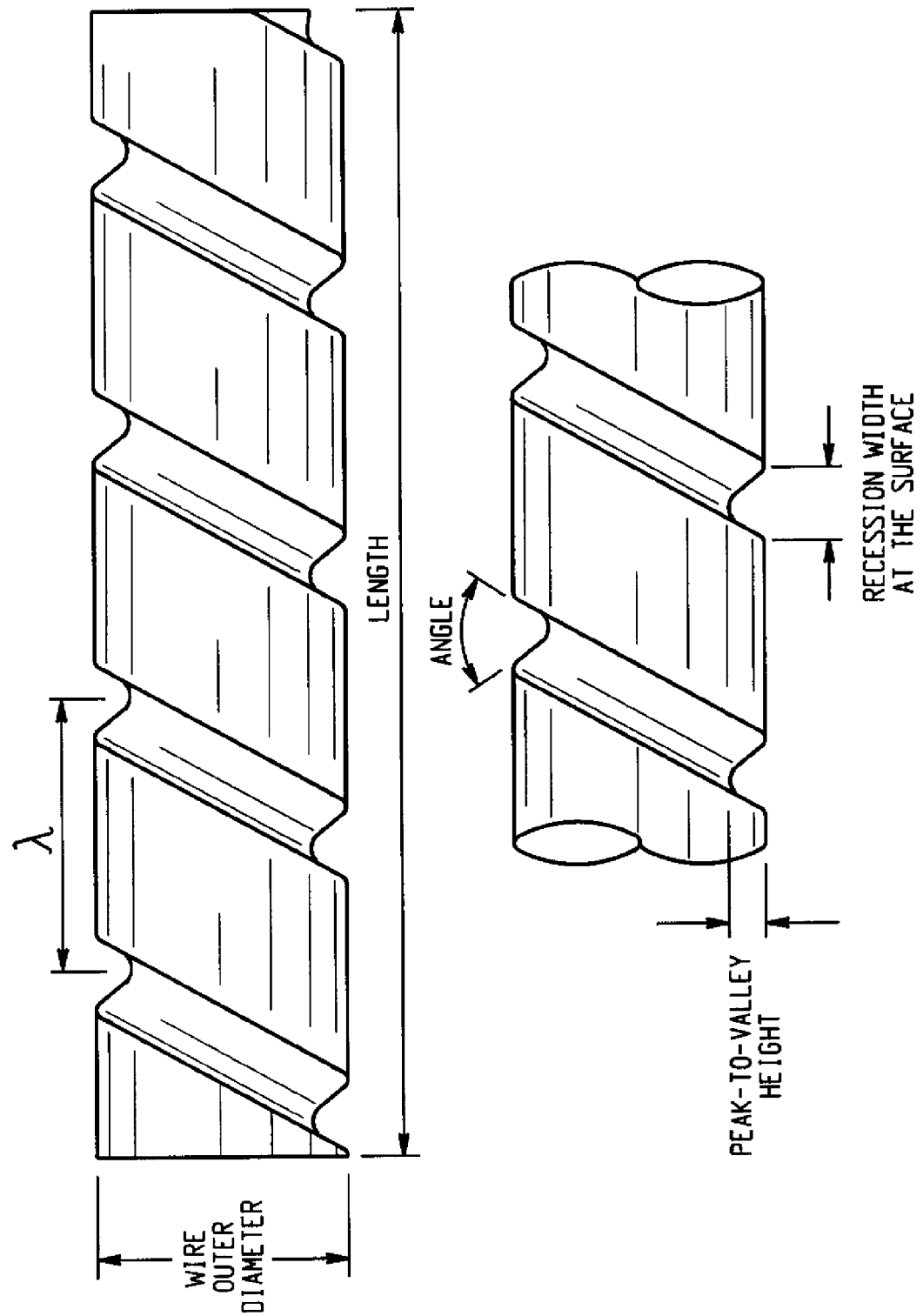
FIG. 3 illustrates a perspective view of an SMA wire after surface texturing.

Disclosed herein are methods for improving adhesion between a shape memory alloy (SMA) and a polymeric material. In one embodiment, the method generally includes subjecting an SMA surface to an etchant to remove a natural oxide/hydroxide layer from the surface of the SMA allowing new oxide/hydroxide groups to grow on the surface of the SMA in a controlled manner. Once this is completed, the new nickel-titanium surface can be treated with any of a number of organophosphorus or phosphorus-containing compounds (i.e., coupling agents) as will be discussed in greater detail below. The phosphorus-end of the resulting "chemical hook" is bound to the newly re-grown nickel-titanium oxide-hydroxide via a condensation reaction. Optionally, the surface topography or microgeometry of the SMA can be textured (or patterned) to increase surface area and provide further improvements in adhesion. The patterning (texturing) can be achieved by additive or subtractive methods and is not intended to be limited. For example, raised portions, discrete humps, and the like can be generated on the SMA surface.

In another embodiment, the SMA surface is functionalized through a combination of surface texturing followed by application of an organosilane coupling agent. The surface texturing extends the surface area for bonding with the coupling agent, thereby providing more so called chemical hooks for interaction with the polymer matrix. Increasing the surface area in this manner advantageously increases adhesion of the polymer to the SMA. It should be noted, that functionalization using a coupling agent, in general, would require hydroxyl groups on the surface of the shape memory alloy.

In still another embodiment, the surface area of the SMA is increased by surface texturing. Increasing the surface area in contact with the polymer matrix through plastic or permanent deformation of at least a portion of the length of the SMA wire has been found to increase adhesion. By way of example, formation of the peaks and valleys can be formed in the SMA surface by over-etching the surface with the oxide etchant using a mask material, by electrochemical etching using a mask material or through the use of an appropriately placed counter electrode, by machining, by an arc discharge processor, by high intensity sonication and the like. The particular method for forming the peaks and valleys is not intended to be limited. Other examples include using a die or stamp. For instance, the wire can be flattened periodically along its length or bent into various forms that promote mechanical interlocking with the polymer matrix, e.g., a spiral, zig-zag, loop, and the like. As such, the methods for improving adhesion include manipulating the surface microgeometry so as to enhance mechanical interlocking or mechanical adhesion with the polymeric material upon its solidification from the liquid or molten state. Manipulation of the surface microgeometry extends the surface area for wetting of the polymeric material when it is in a state wherein it flows, and it flows into the microgeometry (e.g., hemispherical cavities on the surface, raised portions, and the like), and subsequently solidifies (or becomes solid in a manner that polymers become solid), thereby providing a sort of "zipper" effect.

In contrast to the prior art, the disclosed methods improve adhesion of the SMA with a polymeric matrix. The coupling agents function in several ways. They can directly bond to the polymer matrix by reacting with functional groups in the polymeric matrix, or by incorporating themselves into the polymer matrix due to the similarity of their structure to the polymer, or by forming van der Waals interactions with the polymeric matrix. Van der Waals interactions arise from random electron movement in the polymer matrix, which results in irregular charge density distributions that form dipoles. If the dipoles can induce dipoles in an adjacent chemical unit, a relatively strong interaction can occur. Subsequently, more polarizable functional groups, such as aromatic phenyl rings, will interact reasonably well with alkanes. This occurs due to the high polarizability of the electrons located in delocalized p-orbitals of the aryl functionality. Electrons in these orbitals are more easily polarized than those in sigma bonds.

By way of background, shape memory alloys are alloy compositions with at least two different temperature-dependent phases. The most commonly utilized of these phases are the so-called martensite and austenite phases. In the following discussion, the martensite phase generally refers to the more deformable, lower temperature phase whereas the austenite phase generally refers to the more rigid, higher temperature phase. When the shape memory alloy is in the martensite phase and is heated, it begins to change into the austenite phase. The temperature at which this phenomenon starts is often referred to as the austenite start temperature ($A_s$). The temperature at which this phenomenon is complete is called the austenite finish temperature ($A_f$). When the shape memory alloy is in the austenite phase and is cooled, it begins to change into the martensite phase, and the temperature at which this phenomenon starts is referred to as the martensite start temperature ($M_s$). The temperature at which austenite finishes transforming to martensite is called the martensite finish temperature ($M_f$). It should be noted that the above-mentioned transition temperatures are functions of the stress experienced by the SMA sample. Specifically, these temperatures increase with increasing stress. In view of the foregoing properties, deformation of the shape memory alloy is preferably carried out at or below the austenite transition temperature. Subsequent heating above the austenite transition temperature causes the deformed shape memory material sample to revert back to its permanent shape. Thus, a suitable activation signal for use with shape memory alloys is a thermal activation signal having a magnitude that is sufficient to cause transformations between the martensite and austenite phases.

The austenite finish temperature, i.e., the temperature at which the shape memory alloy remembers its high temperature form when heated, can be adjusted by slight changes in the composition of the alloy and through thermo-mechanical processing. In nickel-titanium shape memory alloys, for example, it can be changed from above about 100° C. to below about −100° C. The shape recovery process can occur over a range of just a few degrees or exhibit a more gradual recovery. The start or finish of the transformation can be controlled to within a degree or two depending on the desired application and alloy composition. The mechanical properties of the shape memory alloy vary greatly over the temperature range spanning their transformation, providing shape memory effect, superelastic effect, and high damping capacity. For example, in the martensite phase a lower elastic modulus than in the austenite phase is observed. Shape memory alloys in the martensite phase can undergo large deformations by realigning the crystal structure rearrangement with the applied stress. The material will retain this shape after the stress is removed.

As noted above, shape recovery occurs when the shape memory alloy SMA undergoes deformation while in the malleable low-temperature phase and then encounters heat greater than the transformation temperature (i.e., austenite finish temperature). Recovery stresses can exceed 400 megapascals (60,000 psi). Recoverable strain is as much as about 8% (about 4% to about 5% for the copper shape memory alloys) for a single recovery cycle and generally drops as the number of cycles increases.

The SMA surface to be treated may be in the form of foil, sheet, plate, extrusion, tube, rod, bar, or the like. The specific form as well as composition is not intended to be limited. Suitable shape memory alloy materials include, but are not intended to be limited to, nickel-titanium based alloys, indium-titanium based alloys, nickel-aluminum based alloys, nickel-gallium based alloys, copper based alloys (e.g., copper-zinc alloys, copper-aluminum alloys, copper-gold, and copper-tin alloys), gold-cadmium based alloys, silver-cadmium based alloys, indium-cadmium based alloys, manganese-copper based alloys, iron-platinum based alloys, iron-palladium based alloys, and the like. The alloys can be binary, ternary, or any higher order so long as the alloy composition exhibits a shape memory effect, e.g., change in shape, orientation, yield strength, flexural modulus, damping capacity, superelasticity, and/or similar properties. Selection of a suitable shape memory alloy composition depends on the temperature range where the component will operate. In an exemplary embodiment, the SMA comprises a nickel titanium alloy.

The shape of the SMA surface may be planar, curved or in any other shape. It will, therefore, be understood that the use of the term SMA surface herein is intended to include all such SMA materials, forms, and shapes.

Referring now to FIG. 1, one embodiment of a method of improving adhesion of an SMA surface with a polymeric material is schematically illustrated. Referring to Step 10, an untreated SMA surface is immersed in an etchant for a period of time effective to remove the natural oxide/hydroxide layer, if present, from the SMA surface. This step occurs prior to functionalization with the coupling agent. The particular etchant method is not intended to be limited. Suitable oxide etchants are well known in the art. In an exemplary embodiment, the oxide etchant is an aqueous acid solution containing an acid effective to attack and/or complex with the oxide layer so as to disrupt its stability in order to permit dissolution or exfoliation. For example, a suitable acid has a $K_a$ of greater than 55.5 that substantially or completely dissociates when dissolved in water. Thus, a suitable acid solution includes, but is not intended to be limited to, an inorganic acid such as nitric, chromic acid, hydrochloric, hydrofluoric, phosphoric, sulfuric acid, perchloric acid and combinations thereof. In one embodiment, the acid solution comprises an aqueous solution of 3% hydrofluoric acid and 15% nitric acid.

The SMA surface, wherein the natural oxide/hydroxide layer has been removed, is then allowed to grow a new oxide/hydroxide layer in a controlled manner, generally designated Step 12. Optionally, the SMA surface can then be degreased before removing the natural oxide layer. For example, the SMA surface can be exposed to a solvent mixture such as, but not limited to, one that includes hexanes, alcohol, water, chlorinated solvents, various combinations of degreasers, and the like, or a sequence of solvents or solvent mixtures. Agitation such as by sonication can be accompanied during degreasing as may be desired for some applications. The desired amount and thickness of the newly formed oxide/hydroxide layer is less than 5,000 Å. In one embodiment, the layer is less than 1,000 Å, and in an exemplary embodiment the thickness of the oxide/hydroxide layer is from a few nanometers to about 950 Å. Time of treatment with the oxide etchant in Step 10 can be as short as one second depending on the temperature, agitation, concentration of acid, the amount and thickness of oxide layer formed on the SMA, and the like. Preferred treatment times are generally about 1 second to about 100 seconds or longer, e.g., to 10 minutes, with most preferred times being about 1 to about 30 seconds. In one embodiment, treatment time is about 5 seconds to about 10 seconds.

Once a new oxide/hydroxide layer has been formed on the SMA surface in Step 12 (or after the SMA surface has been patterned with a desired microgeometry), the SMA surface is further contacted with the phosphorous-containing compounds or the organosilane coupling agents in Step 14. In particular embodiments, contacting the SMA surface with the coupling agent can include spraying or immersing.

While not wanting to be bound by theory, the phosphorous-containing compounds and organosilane-coupling agents interact with the newly formed oxide/hydroxide groups and bind to the SMA surface via a condensation reaction to form a functionalized surface. A heating step may be employed after treatment with the coupling agent in order to assure a complete condensation.

The phosphorous-containing compound is preferably an acid selected from the class consisting of monomeric phosphonic acid, monomeric phosphinic acid, or a combination of these acids. The term "monomeric phosphonic acid" is generally defined by the formula, $R_m[PO(OH)_2]_n$ wherein R is one or more radicals having a total of 1-30 carbons; m is the number of radicals in the molecule and is in the range of 1-10; n is the number of phosphonic acid groups in the molecule and is in the range of 1-10.

The term "monomeric phosphinic acid" is generally defined by the formula $R_m R'_o[PO(OH)]_n$ wherein R is one or more radicals having a total of 1-30 carbons; m is the number of R radicals in the molecule and is in the range of 1-10; R' may be hydrogen and may be comprised of 1-30 carbon-containing radicals; o is the number of R' radicals and is in the range of 1-10; n is the number of phosphinic acid groups in the molecule and is in the range of 1-10.

Suitable monomeric phosphonic/phosphinic acids include, but are not meant to be limited to, amino trismethylene phosphonic acid, aminobenzylphosphonic acid, phosphomycin, 3-amino propyl phosphonic acid, O-aminophenyl phosphonic acid, 4-methoxyphenyl phosphonic acid, aminophenylphosphonic acid, aminophosphonobutyric acid, aminopropylphosphonic acid, benzhydrylphosphonic acid, benzylphosphonic acid, butylphosphonic acid, carboxyethylphosphonic acid, diphenylphosphinic acid, dodecylphosphonic acid, ethylidenediphosphonic acid, heptadecylphosphonic acid, methylbenzylphosphonic acid, naphthylmethylphosphonic acid, octadecylphosphonic acid, octylphosphonic acid, pentylphosphonic acid, phenylphosphinic acid, phenylphosphonic acid, phosphonopropionic acid, phthalide-3-phosphonic acid, bis-(perfluoroheptyl) phosphinic acid, perfluorohexyl phosphonic acid and styrene phosphonic acid.

Suitable polymeric phosphonic acids include, but are not meant to be limited to, polyvinyl phosphonic acid, poly(vinylbenzyl)phosphonic acid, poly(2-propene) phosphonic acid, phosphonomethyl ethers of cellulose, phosphonomethyl ethers of polyvinyl alcohol, poly 2-butene phosphonic acid, poly 3-butene phosphonic acid, phosphonomethyl ethers of starch, polystyrene phosphonic acid, polybutadiene phosphonic acid and polyethylene imine methyl phosphonate.

Examples of groups which may comprise R and/or R' include long and short chain aliphatic hydrocarbons, aromatic hydrocarbons, carboxylic acids, aldehydes, ketones, amines, amides, thioamides, imides, lactams, anilines, pyridines, piperidines, carbohydrates, esters, lactones, ethers, alkenes, alkynes, alcohols, nitriles, oximes, organosilicones, ureas, thioreas, perfluoro organic groups, silanes and combinations of these groups.

In one embodiment, the phosphorous-containing compound of Step 14 comprises an aqueous solution of about 1% phenylphosphonic acid (PPPA). In an exemplary embodiment, the solution comprises an aqueous solution of about 5% PPPA.

The functionalized layer formed in Step 14 exhibits a preferred orientation of the reaction product, e.g., phosphonate or phosphinate, such that the hydroxyl groups are attached to the SMA surface while the R or R' groups extend away from that surface. Depending on the R or R' group, the functionalized layer can have a chemical reactivity ranging from non-reactive to very reactive.

A desired polymeric material is then contacted with the functionalized SMA surface as shown generally in step 16. The polymeric material can be injection molded onto the SMA, extruded, coated, polymerized, or otherwise disposed onto the SMA wire. The particular means for providing the polymer on the SMA surface is not intended to be limited. The reactive group provided by the functionalization with the above noted coupling agents is selected to interact with the particular polymeric material to improve adhesion. In one embodiment, the R group of the functionalized surface interacts chemically with the polymeric material. In another embodiment, the R group can be designed to enhance van der Waals forces or weak, long range interactions with an essentially non-reactive polymeric material. In a third embodiment, the groups may entangle segments of the polymer chain.

Referring now to FIG. 2, another embodiment of a method for improving adhesion of an SMA surface with a polymeric material is schematically illustrated. In this method, the SMA substrate surface is first textured as set forth in step 22. Prior to texturing, the SMA substrate may optionally be exposed to an etchant as shown in step 20 to remove the natural oxide layer, if present. The textured surface is then chemically functionalized by reaction with a silane coupling agent as indicated at step 24. A polymeric material can be injection molded onto the functionalized SMA, extruded, coated, polymerized, or otherwise disposed onto the SMA wire as indicated at step 26.

The organosilane-coupling agent generally refers to a class of organosilane compounds having at least two reactive groups of different types bonded to the silicon atom in a molecule. One of the reactive groups of different types (e.g., chloro, acetoxy, methoxy, ethoxy, amino, and silanolic hydroxy groups) is reactive with the surface hydroxides on the SMA surface while the other of the reactive groups (e.g., vinyl, epoxy, methacryl, amino and mercapto groups) is reactive with various kinds of organic materials or synthetic resins to form a chemical bond.

Suitable silane coupling agents include, but are not limited to, aminosilanes, vinylsilanes, acryloxysilanes, epoxy silanes, mercaptosilanes, and the like.

By way of example, representative aminosilanes include, but are not limited to, aminopropyltriethoxysilane, aminopropyltrimethoxysilane, aminopropylmethyldiethoxysilane, aminopropylmethyldimethoxysilane, aminoethylaminopropylmethyldimethoxysilane, diethylenetriaminopropyltriethoxysilane, diethylenetriaminopropyltrimethoxysilane diethylenetriaminopropylmethyldiethoxysilane, phenylaminomethyltrimethoxysilane diethylenetriaminopropylmethyldimethoxysilane, cyclohexylaminopropyltrimethoxysilane, phenylaminomethyltriethoxysilane, cyclohexylaminopropyltriethoxysilane, diethylaminomethyltriethoxysilane, (diethylaminoethyl)methyldiethoxysilane, methylaminopropyltrimethoxysilane, hexamethyldisilazane, and the like. Representative vinylsilanes include, but are not limited to, vinylchlorosilane, vinyltriethoxysilane, vinyltrimethoxysilane, and the like. Representative epoxysilanes include, but are not limited to, glycidoxypropyltriemthoxylsilane, glycidoxypropylmethyldiethoxysilane, (3,4-epoxycyclohexyl)ethyltrimethoxysilane, and the like. Representative mercaptosilanes include, but are not limited to, mercaptopropyltrimethoxysilane, and the like. Representative acryloxysilanes include, but are not limited to, 3-methacryloxypropyltrimethoxysilane, and the like. The selection of the particular organosilane will generally depend on the polymer and the SMA composition, which is well within the skill of those in the art.

The thickness of the functionalizing layer in any of the embodiments discussed above is less than 1000 Å and in other embodiments is less than 200 Å. In an exemplary embodiment, the thickness is about 20 to about 100 Å.

The coupling agents (silane or phosphorous) listed above may also include inorganic groups substituted thereon. While it is preferred that the free end of the organic group extends away from the SMA surface, additional functional groups on the free end of the molecule are contemplated. By attaching additional functional groups, either organic or inorganic, a wide variety of surface characteristics can be achieved.

Examples of additional functional groups may include, for example, a carboxyl group, a glucose group, a cyano group, a cyanate group, isocyanate group and thiocyanate group, a phenyl group, a diphenyl group, a tertiary butyl group, a sulfonic group, a benzyl sulfonic group, a phosphate group, a phosphinate group, a phosphinite group, a phosphonate group and combinations of these groups.

Optionally, the functional group may be further reacted after formation of the phosphorous-containing or silane layer on the SMA surface to provide the desired functionalization. For example, it may be desirable to further react the R group after formation of the phosphorous-containing layer if reacting the R group prior to treatment of the SMA surface would interfere with such treatment or with the bond formed between the oxide/hydroxide layer and the acid group of the phosphonic/phosphinic acid molecule.

Moreover, while specific reference has been made to silane and phosphorous coupling agents, it should also be noted that it is believed that organotitanides, organic anhydrides, and some organic acids could function in a similar manner. For example, it is believed that these materials could be made to react with the surface hydroxyl groups on the SMA wire and provide increased adhesion to the polymeric matrices.

In another embodiment, FIG. 3 illustrates a perspective view of an SMA wire after surface texturing. In a preferred embodiment, the texturing step includes forming a sinusoidal pattern consisting of peaks and valleys. The angle, wavelength, peak to valley height, and the like can be optimized for the intended application, which is well within the skill of those in the art. Other suitable surface texturing profiles include, but are not intended to be limited to, arrays of hemispherical craters positioned in various configurations, e.g., a diamond-like array (where the centers of adjacent craters on the wire surface sit at the corners of a diamond pattern) and a hexagonal-like configuration (where the centers of adjacent craters on the wire surface sit at the corners of a hexagon with an additional crater at the center of the hexagon). Likewise, there can be various interconnecting channels, helical patterns, and the like. Surface texturing of the SMA surface so as to increase surface area can be made by over-etching the surface with the oxide etchant using a mask material, by electrochemical etching using a mask material, by electrochemical etching using a counter electrode, by machining, by an arc discharge processor, by high intensity sonication and the like. The particular method for forming the peaks and valleys is not intended to be limited.

Suitable polymeric materials include, but are not intended to be limited to, polypropylenes, polyethylenes, polyamides, acrylates, polyurethanes, polyacrylamide, polytetrafluoroethylene, polystyrenes, polyethylene terephthalates, various rubbers such as polyisoprenes and polychloroprenes, epoxies, vinyl resins, polyesters, fluorocarbons, polyacrylonitriles, polyvinylidene chlorides, phenolic resins, cellulose derivatives, polyvinyl acetates, silicones, copolymers of butadiene and styrene, and the like as well as derivatives thereof.

The properties of the functionalized layer may be controlled for specific applications. Properties such as wetting, chemical reactivity, polarity, hydrophobicity, hydrophilicity and thermal stability can affect the performance for the intended application.

SMA surfaces can be modified by the use of the functionalized layer to achieve higher performance in all types of bonding. Advantageously, the functionalized layer can be designed to enhance van der Waals forces or weak, long range interactions with an essentially non-reactive polymeric material and improve interfacial adhesion. The use of thermoplastic olefin material, for example, can be valuable because it is less costly than other polymeric materials such as nylon, polyurethane, or epoxy, and is used extensively in automotive components, for example.

Another advantage of the present disclosure is that some of the phosphorus containing compounds, e.g., the phosphinic acids, and their derivatives are known to render metal surfaces resistant to corrosion since they "cap-off" natural holes in the metal surface thereby precluding the entry of moisture onto the surface.

This disclosure is further illustrated by the following non-limiting examples.

EXAMPLE 1

Nickel titanium wires were pre-treated by immersion into an aqueous solution of 3% hydrofluoric acid and 15% nitric acid solution until the oxide layer was visibly removed from the surfaces of the wires. One set of wires received a 20-minute soak in 1% phenylphosphonic acid (PPPA) at room temperature. Another set of wires received a 20 minute soak with ultrasonication in 5% PPPA. Another set of wires was hand-sanded, another set of wires was left untreated, and a final set of wires was treated only with the aforementioned aqueous solution of strong acid.

Each treated and untreated wire was placed into an injection mold, into which a molten polymeric material was injected. The polymeric material was allowed to solidify around the wire, embedding the wire in the polymeric material and adhering the wire to the polymeric material.

Upon observation, the untreated nickel titanium wire was not properly embedded in the thermoplastic olefin matrix, the hand sanded nickel titanium wire was also not properly embedded in the thermoplastic olefin matrix, while the nickel titanium wire treated with 5% PPPA was uniformly embedded within the thermoplastic olefin matrix. The uniformly embedded wire was indicative of desired adhesion of the wire to the thermoplastic olefin matrix. By use of the term "uniformly embedded" it is meant that the wire remains straight inside the polymer with a fixed distance to the surface along its length. By use of the term, "not properly embedded", it is meant that the wire is curved and its distance to the upper surface varies to the point that, in most cases, part of the wire was visibly exposed.

Improvement in adhesion was measured by pullout force, or applied force required to induce wire slip within the polymer matrix per unit of embedded length. The sample was constrained such that no compressive stress was applied to the matrix. The sample was located in a dead-weight fixture. The force at the end of the wire (given by weight) increased slowly from 0 up to the required force (weight) to pull the entire wire out of the matrix The samples were cut such that the same embedded length was used in all the samples. Most samples were cut with an embedded length of 90 mm. Of the set of samples used in the pullout tests, 5 samples were of untreated wire, 4 samples were of hand-sanded wire, 5 samples were of pre-treatment acid-treated wire, 8 samples were of wire treated with 1% PPPA, and 8 samples were of wire treated with 5% PPPA.

Figure 4:
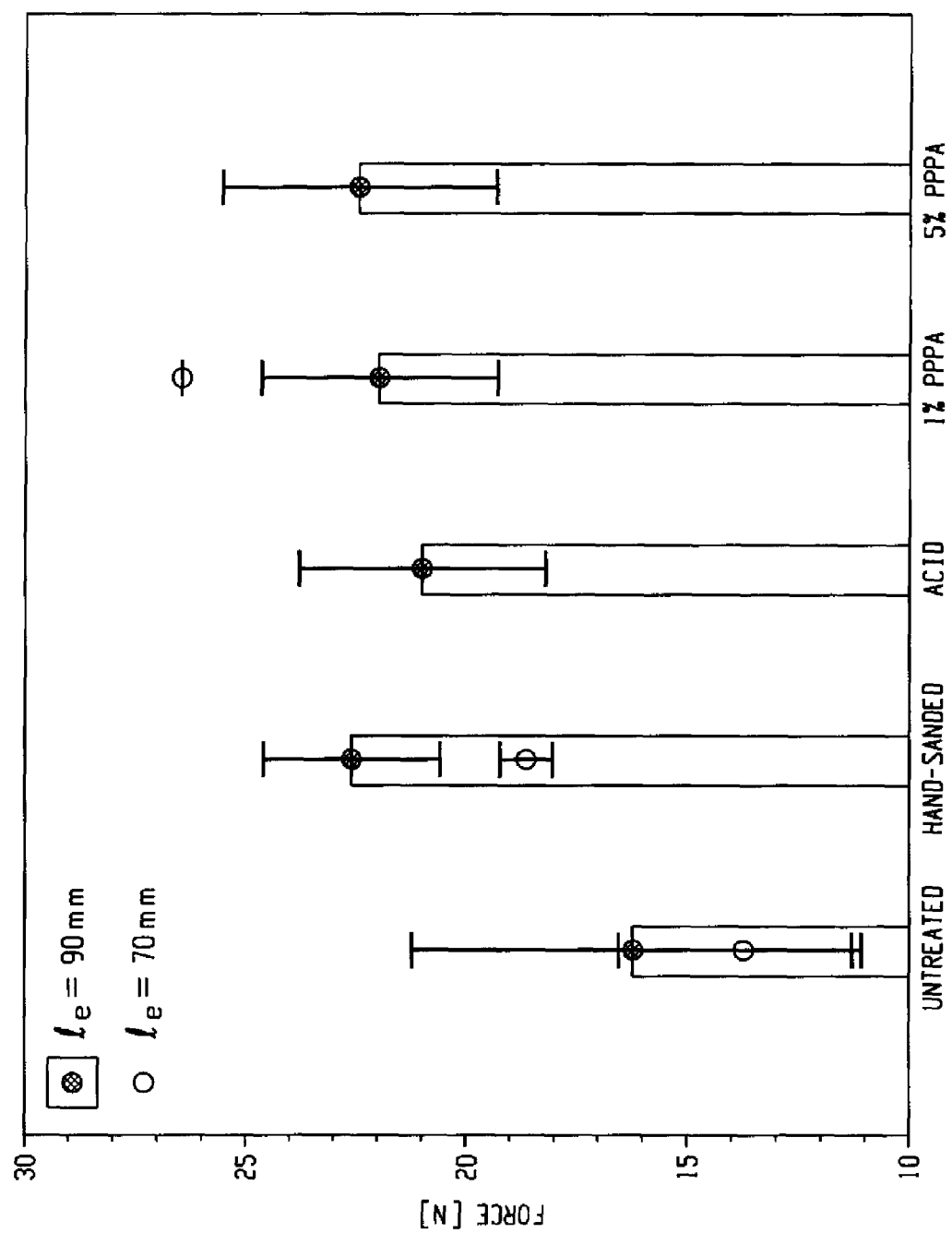
FIG. 4 is a graph showing applied force required to induce wire slip per unit of embedded length within the polymer matrix for a series of nickel titanium wire samples.

The maximum force required to pull each wire entirely out of the polymer matrix was recorded. FIG. 4 graphically shows the set of results from 15 samples using the untreated wire (8 with embedded length of 90 mm and 4 with embedded length of 70 mm), 8 samples with the hand-sanded wires, 5 samples with the pre-treatment acid, 9 with 1% PPPA and 8 with the 5% PPPA. The solid dots represent the experiments done with specimens with an embedded length of 90 mm. The empty dots represent a few samples with an embedded length of 70 mm. The bars represent the average and the number in their bases represent the number of samples tested with an embedded length of 90 mm (70 mm). Also included are the mean and standard deviation of the force per unit of embedded length required to pull each wire entirely out of the polymer matrix.

Table 1 shows the maximum force recorded, the minimum force recorded, and the mean and standard deviation of force required per unit of embedded length to pull the sample wires out of the matrix.

TABLE 1

| | # samples ($l_e$ = 90 mm) | Mean ± stand. Dev. [Newtons] | Min. Force recorded [Newtons] | Max. Force recorded [Newtons] |
|---|---|---|---|---|
| Untreated | 5 | 16.22 ± 5.06 | 6.87 | 22.22 |
| Hand-sanded | 4 | 22.65 ± 2.01 | 19.22 | 24.29 |
| Acid | 5 | 20.95 ± 2.77 | 18.87 | 26.36 |
| 1% PPPA | 8 | 22.02 ± 2.64 | 18.13 | 25.67 |
| 5% PPPA | 8 | 22.44 ± 3.07 | 18.03 | 28.03 |

The least amount of force recorded to pull a sample wire out of the matrix correlated with an untreated wire embedded in the matrix. The greatest amount of force recorded to pull a sample wire out of the matrix correlated with a wire treated with 5% PPPA embedded in the matrix. According to the calculated mean and standard deviation, the hand-sanded wire samples required the greatest amount of force to be pulled from the polymer matrix. However, an observation that was not quantified was that, once the maximum force was reached and the entire wire started moving, the speed at which the wire moved was much slower for the wires treated with the PPPA.

EXAMPLE 2

In this example, SMA wires having a diameter of about 0.5 millimeters were first immersed in an etch solution containing concentrated $H_2SO_4$ with sonication for about 20 minutes. The SMA wire was then degreased in a solution containing hexanes, isopropyl alcohol and distilled water. To enhance surface hydroxides on the SMA wire, the SMA wire was subjected to a base/acid sequence. The SMA wire was then immersed in a pre-hydrolyzed solution of 2 weight percent (wt %) of 3-aminopropyltriethoxysilane in a 95% ethanol/5% water solution. A masking tape was wound about the wire in a spiral pattern, wherein the exposed regions were etched to form valleys in the wire. As such, a helical topography was formed on the SMA wire by electrochemical etching.

The SMA wires were embedded to a depth of about 2.5 cm in a polyurethane mold of 9.3 centimeters (cm)×2.5 cm×1.5 cm. The polyurethane was a two-component system of Conathane TU-971 having a Shore D hardness of 70. The polyurethane was room temperature processed and cured.

Table 2 provides results of a pull out test comparing the SMA wires as prepared with the helical topography above with untreated SMA wires that were hand sanded, hand sanded in the vertical direction or hand sanded in the horizontal direction. Also included in this comparison were SMA wires that were acid etched only using an etch solution containing 1 part HF, 4.4 parts $HNO_3$ and 25.8 parts $H_2O$. The surfaces of the hand sanded and acid etched SMA wires were not functionalized with a coupling agent. Table 2 also includes comparative data illustrating the effect of forming a helical pattern in the surface of the SMA wire. The term "$\tau$" represents shear strength, which can be defined as $\tau = F/D\pi l_e$, wherein F is the maximum pull-out force, D the wire diameter and $l_e$ the embedding length of the wire (i.e., portion of the wire that is embedded in the polymer).

TABLE 2

| | Maximum Force Newtons (N) | Surface Area (mm²) | τ (MPa) | Result |
|---|---|---|---|---|
| Untreated | 136.35 | 38.09 | 3.58 | wire pulled out from polymer |
| Hand-sanded (horizontal) | 235.18 | 36.55 | 6.43 | wire pulled out from polymer |
| Hand-sanded (vertical) | 97.19 | 44.53 | 2.18 | wire pulled out from polymer |
| Acid Etch | 241.96 | 42.87 | 5.64 | wire pulled out from polymer |
| Functionalized (patterned) | 297.14 | 42.07 | 7.06 | wire broke |
| Functionalized (patterned) | 279.73 | 42.07 | 6.65 | wire broke |
| Functionalized (not patterned) | 136.05 | 12.06 | 11.28 | wire pulled out from polymer |
| Functionalized (not patterned) | 209.00 | 22.98 | 9.09 | wire pulled out from polymer |

As shown above, the functionalized (with a coupling agent as previously described) and patterned SMA wire broke whereas all of the other SMA wires were pulled from the polymer. Thus, functionalizing the surface of the SMA and/or surface texturing provided a marked increase in pull force, wherein the combination of surface texturing and functionalization exceeded the tensile strength of the SMA as evidenced by the wire breakage.

EXAMPLE 3

In this example, samples of Nitinol SMA were variously treated. For those SMA wires having a textured surface, acid etching was done by immersion in 1HF: 4.4HNO$_3$: 25.81H$_2$O. Samples treated with a silane coupling agent were prepared by etching the oxide layer of the SMA in concentrated H$_2$SO$_4$ (sonication for 20 minutes), and then degreased in hexanes, isopropyl alcohol and deionized water (20 min. sonication in each solvent). To enhance the concentration of surface hydroxides needed for preparing silylated surfaces, the Nitinol wire was then immersed in a base/acid sequence. The Nitinol wire was then immersed in pre-hydrolyzed solution of 2-wt % of 3-aminopropyltriethoxysilane (APTES) in 95% ethanol-5% water. Helical patterns were made by electrochemical etching. Nitinol wire was prepared by wrapping a thin stripe of electroplating masking tape around the wire in a spiral pattern. Preliminary experiments were carried out by using an etching solution of 4 parts ethanol and 1 part HClO$_4$ at −50° C. and applying DC 25V. Etching rate under these conditions was ~50 micrometers (μm)/minute (min) and carried out to provide a depth of about 110 μm. In addition, a portion of the samples was hand-sanded to create horizontal or vertical grooves followed by sonication for 20 min in hexanes, isopropyl alcohol and DI water. Threaded Nitinol wire was machined by die tapping to a surface depth of about 18 μm.

The Nitinol wires were then embedded in polyurethane using a mold having dimensions of 9.3 centimeter (cm)×2.5 cm×1.5 cm. Embedded depth of the wires was ~2.5 cm. The polymer choice was a two-component system Conathane TU-971 (Hardness 70 Shore D), which was room temperature processed and cured.

Figure 5:
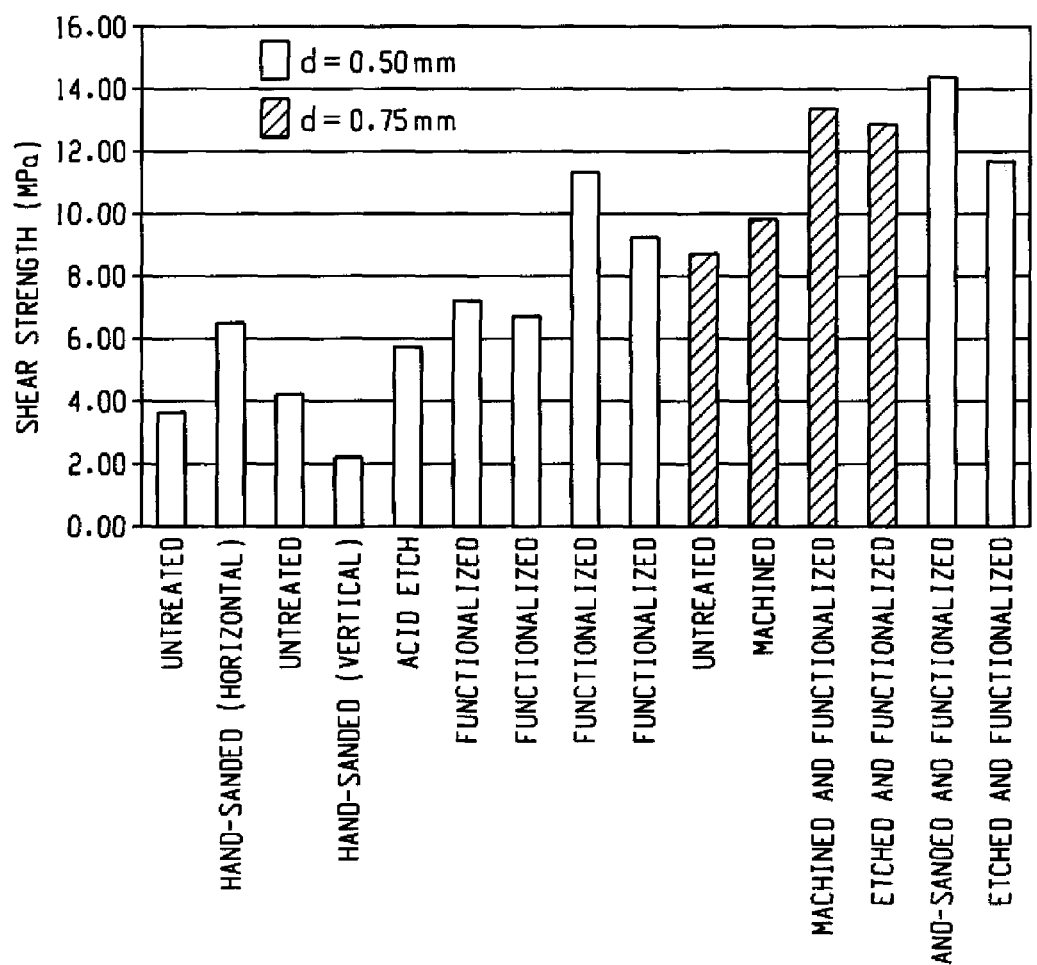
FIG. 5 is a graph showing shear strength required to induce wire slip per unit of embedded length within the polymer matrix for a series of nickel titanium wire samples.

The results are shown in Tables 3, 4 and FIG. 5.

TABLE 3

| Treatment | Diameter (mm) | Maximum Force (N) | Surface area (mm$^2$) | τ (MPa) | Depth Embedded (mm) | Notes |
|---|---|---|---|---|---|---|
| Untreated | 0.5 | 136.35 | 38.09 | 3.58 | 24 | wire was pulled out from polymer |
| Hand-sanded (horizontal) | 0.48 | 235.18 | 36.55 | 6.43 | 24 | wire was pulled out from polymer |
| Untreated | 0.5 | 178.75 | 42.8 | 4.18 | 27 | wire was pulled out from polymer |
| Hand-sanded (vertical) | 0.52 | 97.19 | 44.53 | 2.18 | 27 | wire was pulled out from polymer |
| Acid Etch | 0.54 | 241.96 | 42.87 | 5.64 | 25 | wire was pulled out from polymer |
| Functionalized | 0.53 | 297.14 | 42.07 | 7.06 | 25 | wire broke first |
| Functionalized | 0.53 | 279.73 | 42.07 | 6.65 | 25 | wire broke first |
| Functionalized | 0.48 | 136.05 | 12.06 | 11.28 | 8 | wire was pulled out from polymer |
| Functionalized | 0.48 | 209.00 | 22.98 | 9.09 | 15 | wire was pulled out from polymer |

TABLE 4

| Treatment | Diameter (mm) | Maximum Force (N) | Surface area (mm$^2$) | τ (MPa) | Depth Embedded (mm) |
|---|---|---|---|---|---|
| Untreated | 0.75 | 145.12 | 16.73 | 8.67 | 7.10 |
| Machined | 0.75 | 258.71 | 26.53 | 9.75 | 11.26 |
| Machined + functionalized | 0.75 | 399.54 | 30.07 | 13.29 | 12.76 |
| Etched + functionalized | 0.75 | 321.18 | 25.02 | 12.84 | 10.62 |
| Hand-sanded + functionalized | 0.5 | 179.85 | 12.57 | 14.31 | 8.00 |
| Etched + functionalized | 0.5 | 139.80 | 11.95 | 11.70 | 7.61 |

Relative to no treatment of the Nitinol wire, an increase in shear strength to remove the wire was observed by texturing the surface with the exception of hand sanding in the vertical direction, which showed a decrease in shear force. Further gains in adhesion as demonstrated by the increased shear strength were observed upon functionalization with the silane-coupling agent.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A method for improving adhesion between a shape memory alloy and a polymeric material, comprising:
   contacting a surface of a shape memory alloy with a solution comprising phosphorous-containing compound; and
   embedding the shape memory alloy in a polymeric material.

2. The method according to claim 1, wherein the solution comprising the phosphorous-containing compound comprises an aqueous solution of phenylphosphonic acid.

3. The method according to claim 1, wherein the shape memory alloy comprises a nickel titanium alloy.

4. The method according to claim 1, further comprising texturing the shape memory alloy surface prior to contacting the surface with the solution comprising the phosphorous-containing compound.

5. The method according to claim 1, further comprising removing an oxide/hydroxide layer from the surface of the shape memory alloy with an acidic solution and forming a new oxide/hydroxide layer on the surface of the shape memory alloy prior to contacting the surface with the solution comprising the phosphorous-containing compound.

6. The method according to claim 5, wherein the acidic solution comprises an aqueous solution of an inorganic acid.

7. The method according to claim 1, wherein the phosphorous-containing compound comprises a reactive functional group.

8. The method according to claim 7, wherein the reactive functional group interacts with the polymeric material.

9. The method according to claim 1, wherein the solution comprising the phosphorous-containing compound comprises a monomeric phosphonic acid, a monomeric phosphinic acid, a polymeric phosphonic acid, or a combination comprising at least one of the foregoing acids.

10. The method according to claim 9, wherein the monomeric phosphonic acid is generally defined by the formula $R_m[PO(OH)_2]_n$, wherein R is one or more radicals having a total of 1-30 carbons; m is the number of radicals in the molecule and is in the range of 1-10; n is the number of phosphonic acid groups in the molecule and is in the range of 1-10.

11. The method according to claim 9, wherein the monomeric phosphinic acid is generally defined by the formula $R_m R'_o[PO(OH)]_n$ wherein R is one or more radicals having a total of 1-30 carbons; m is the number of R radicals in the molecule and is in the range of 1-10; R' may be hydrogen and may be comprised of 1-30 carbon-containing radicals; o is the number of R' radicals and is in the range of 1-10; n is the number of phosphinic acid groups in the molecule and is in the range of 1-10.

12. A method for improving adhesion between a shape memory alloy and a polymeric material, comprising:
   texturing a surface of the shape memory alloy; and
   embedding the shape memory alloy in a polymeric material.

13. The method of claim 12, further comprising contacting the surface of the shape memory alloy with a solution comprising an organosilane compound prior to embedding.

14. The method of claim 12, wherein texturing the surface comprises over-etching the surface with the oxide etchant using a mask material, electrochemical etching using a mask material, electrochemical etching using a counter electrode, machining, an arc discharge process or high intensity sonication, or a combination thereof.

15. The method of claim 12, wherein texturing the surface comprises forming peaks and valleys and wherein embedding compromises uniformly embedding the shape memory alloy in the polymeric material.

16. The method of claim 15, wherein the forming of the peaks and valleys in the surface of the shape memory alloy comprises masking portions corresponding to the peaks and etching unmasked portions to form the valleys.

17. The method of claim 12, wherein texturing comprises plastically or permanently deforming at least a portion of the shape memory alloy to form a mechanical interlock with the polymeric material.

18. The method of claim 17, wherein texturing the surface comprises over-etching the surface with an oxide etchant using a mask material, electrochemical etching using a mask material, electrochemical etching using a counter electrode, machining, an arc discharge process or high intensity sonication, or a combination thereof.

19. A method for improving adhesion between a shape memory alloy and a polymeric material, comprising:
   texturing a surface of the shape memory alloy to form a textured surface;
   contacting the textured surface of a shape memory alloy with a solution comprising a phosphorous-containing compound or a silane coupling agent; and
   embedding the shape memory alloy in a polymeric material.

20. The method according to claim 19, further comprising removing an oxide/hydroxide layer from the surface of the shape memory alloy with an acidic solution and forming a new oxide/hydroxide layer on the surface of the shape memory alloy prior to contacting the surface with the solution comprising the phosphorous-containing compounds.

21. The method according to claim 19, wherein the solution comprising the phosphorous-containing compound comprises a monomeric phosphonic acid, a monomeric phosphinic acid, a polymeric phosphonic acid, or a combination comprising at least one of the foregoing acids.

22. The method according to claim 19, wherein texturing the surface comprises forming peaks and valleys.

23. The method of claim 22, wherein the forming of the peaks and valleys in the surface of the shape memory alloy comprises masking portions corresponding to the peaks and etching unmasked portions to form the valleys.

24. A method for embedding a shape memory alloy in a polymeric material, comprising:
   contacting a surface of a shape memory alloy with a solution comprising phosphorous-containing compound; the shape memory alloy comprising at least two temperature dependent phases and configured to transform from a deformed shape to a permanent shape by a phase transformation from one to the other of the at least two temperature dependent phases; and
   embedding the shape memory alloy in a polymeric material.

* * * * *